United States Patent
Ito et al.

(10) Patent No.: US 10,593,547 B2
(45) Date of Patent: Mar. 17, 2020

(54) PHOTOCURABLE COMPOSITION, AND METHODS USING THE SAME FOR FORMING CURED PRODUCT PATTERN AND FOR MANUFACTURING OPTICAL COMPONENT, CIRCUIT BOARD AND IMPRINTING MOLD

(71) Applicant: CANON KABUSHIKI KAISHA, Tokyo (JP)

(72) Inventors: Toshiki Ito, Kawasaki (JP); Takeshi Honma, Tokyo (JP); Shiori Yonezawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/506,214

(22) PCT Filed: Aug. 18, 2015

(86) PCT No.: PCT/JP2015/004082
§ 371 (c)(1),
(2) Date: Feb. 23, 2017

(87) PCT Pub. No.: WO2016/031175
PCT Pub. Date: Mar. 3, 2016

(65) Prior Publication Data
US 2017/0287695 A1     Oct. 5, 2017

(30) Foreign Application Priority Data

Aug. 26, 2014  (JP) .................................. 2014-171224
Jun. 10, 2015  (JP) .................................. 2015-117799

(51) Int. Cl.
*H01L 21/027*     (2006.01)
*C08F 2/44*       (2006.01)
(Continued)

(52) U.S. Cl.
CPC .............. *H01L 21/027* (2013.01); *C08F 2/44* (2013.01); *C08F 2/48* (2013.01); *C08F 2/50* (2013.01);
(Continued)

(58) Field of Classification Search
CPC ........ B29D 11/00355; B29D 11/00442; B33Y 70/00; C08F 22/32; C08F 2/50;
(Continued)

(56) References Cited

U.S. PATENT DOCUMENTS 5,972,807 A * 10/1999 Tani ...................... H05K 3/4676
                                                     442/164
6,372,398 B1 * 4/2002 Yamada ................... G03G 5/10
                                                     399/159
(Continued)

FOREIGN PATENT DOCUMENTS

CN         1153794 A       7/1997
JP         10-293402 A     11/1998
(Continued)

OTHER PUBLICATIONS

Gokan, H. et al. Dry Etch Resistance of Organic Materials, Journal of the Electrochemical Society, Jan. 1983, pp. 143-146, vol. 1, doi:10.1149/1.2119642.

*Primary Examiner* — Edward Chin
(74) *Attorney, Agent, or Firm* — Canon U.S.A., Inc. IP Division

(57) ABSTRACT

A photocurable composition contains a polymerizable compound (A) satisfying $O_A = N_A/(N_{C,A} - N_{O,A})$, wherein $N_A$, $N_{C,A}$ and $N_{O,A}$ represent the total number of atoms, the number of carbon atoms, and the number of oxygen atoms, respectively, in (A); and a non-polymerizable component (E) containing at least one compound (X) including a photopolymerization initiator (B), in a proportion of 10% to
(Continued)

50% relative to the total weight of (A) and (E). The component (E) has a weight average molecular weight of 250 or less. The compound (X) satisfies $O_X = N_X/(N_{C,X} - N_{O,X})$. $N_X$, $N_{C,X}$ and $N_{O,X}$ represent the total number of atoms, the number of carbon atoms, and the number of oxygen atoms, respectively, in the corresponding compound (X). The composition satisfies: $O_A - O_E > 1.00$; and $O_{AE} < 3.40$. $O_E$ and $O_{AE}$ represent the molar fraction weighted averages of $O_X$'s and of $O_A$ and $O_E$, respectively.

22 Claims, 1 Drawing Sheet

(51) Int. Cl.
    *C08F 2/48*         (2006.01)
    *G03F 7/027*       (2006.01)
    *C09D 4/00*        (2006.01)
    *C08F 2/50*         (2006.01)
    *C08F 222/10*      (2006.01)
    *G03F 7/00*         (2006.01)

(52) U.S. Cl.
    CPC .......... *C08F 222/1006* (2013.01); *C09D 4/00* (2013.01); *G03F 7/0002* (2013.01); *G03F 7/027* (2013.01)

(58) Field of Classification Search
    CPC ............ G03F 7/029; H05K 2201/0154; H05K 2201/0212; H05K 2203/0773; H05K 3/0023; H05K 3/381; H05K 3/4644; H05K 3/467; H05K 3/4676
    USPC ........... 430/281.1, 321; 442/164, 63, 69, 70; 522/12, 16, 17, 173, 18, 20, 23, 24, 28, 522/29, 6; 525/180, 183
    See application file for complete search history.

(56) References Cited

U.S. PATENT DOCUMENTS

| | | | |
|---|---|---|---|
| 6,503,959 B1* | 1/2003 | Nishiyama | G03F 7/029 522/16 |
| 2005/0228062 A1* | 10/2005 | Wolf | C08F 2/50 522/6 |
| 2010/0133728 A1* | 6/2010 | Yonezawa | B82Y 10/00 264/496 |
| 2010/0273109 A1* | 10/2010 | Ito | B29D 11/00355 430/321 |
| 2014/0220353 A1 | 8/2014 | Kodama et al. | |

FOREIGN PATENT DOCUMENTS

| | | |
|---|---|---|
| JP | 11-119019 A | 4/1999 |
| JP | 11-133597 A | 5/1999 |
| JP | 11-209632 A | 8/1999 |
| JP | 2002-196489 A | 7/2002 |
| JP | 2002-220408 A | 8/2002 |
| JP | 2002-251007 A | 9/2002 |
| JP | 2007-186570 | 7/2007 |
| JP | 2010-114209 A | 5/2010 |
| JP | 2013189537 A | 9/2013 |
| JP | 2013-253150 A | 12/2013 |
| WO | 2013-136858 A | 9/2013 |
| WO | 2014-065149 A1 | 5/2014 |

* cited by examiner

FIG. 1A  STEP [1] 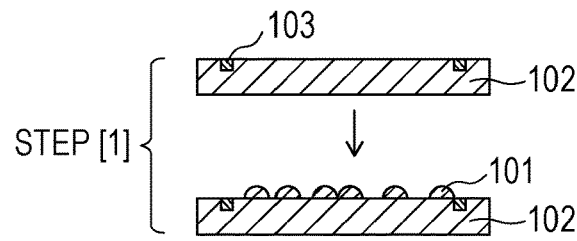
FIG. 1B  STEP [2] 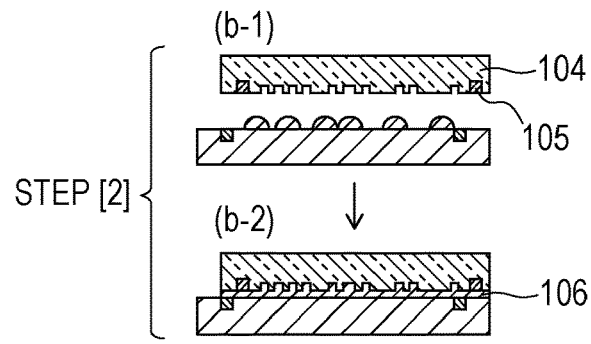
FIG. 1C  STEP [3] 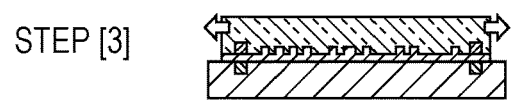
FIG. 1D  STEP [4] 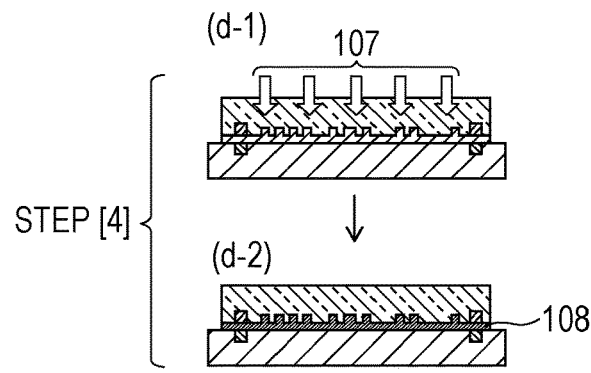
FIG. 1E  STEP [5] 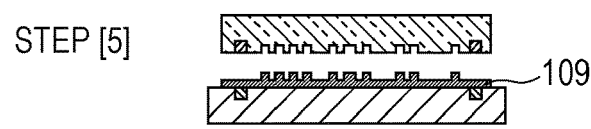
FIG. 1F  STEP [6] 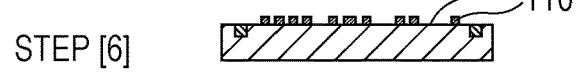
FIG. 1G  STEP [7] 

PHOTOCURABLE COMPOSITION, AND METHODS USING THE SAME FOR FORMING CURED PRODUCT PATTERN AND FOR MANUFACTURING OPTICAL COMPONENT, CIRCUIT BOARD AND IMPRINTING MOLD

CROSS-REFERENCE TO RELATED APPLICATIONS

This application is a National Stage filing of International Application No. PCT/JP2015/004082 filed Aug. 18, 2015, which claims the benefit of Japanese Patent Application No. 2014-171224, filed Aug. 26, 2014 and Japanese Patent Application No. 2015-117799, filed Jun. 10, 2015, the disclosures of each of which are hereby incorporated by reference herein in their entirety.

TECHNICAL FIELD

The present invention relates to a photocurable composition, and method using the photocurable composition for forming a cured product pattern and for manufacturing an optical component, a circuit board and an imprinting mold.

BACKGROUND ART

In the field of semiconductor devices, microelectromechanical systems (MEMS) and the like, miniaturization is increasingly demanded, and a photo-nanoimprinting technique is attracting attention, accordingly.

In the photo-nanoimprinting technique, a mold having a fine relief pattern on the surface thereof is pressed against a substrate to which a photocurable composition (resist) has been applied, and the photocurable composition is cured in this state. Thus, the relief pattern of the mold is transferred to a cured product of the photocurable composition to yield a pattern on the substrate. The photo-nanoimprinting technique enables a fine structure of the order of several nanometers to be formed on a substrate.

In a photo-nanoimprinting technique, first, a resist is applied to the region on a substrate to which a pattern will be formed (application step). Subsequently, the resist is formed into a pattern in a mold having a pattern (mold contact step). Then, the resist is cured by being irradiated with light (irradiation step), and separated from the mold (mold-releasing step). Through these steps, a resin pattern (photo-cured film) having a specific shape is formed on the substrate.

The cured product pattern, or photo-cured film, formed on the substrate by the photo-nanoimprinting technique may be used as a mask for processing a base substrate by dry etching. In this operation, the photocurable composition is desirably resistant to dry etching from the viewpoint of processing the base substrate with a high yield.

The resistance to dry etching (hereinafter referred to as dry etching resistance) of the photocurable composition depends on the constituents of the photocurable composition and the proportions thereof. The viscosity of the photocurable composition also depends on the constituents of the photocurable composition and the proportions thereof.

Viscous photocurable compositions are slow to fill the mold. More specifically, such a photocurable composition is slow to spread over the substrate when applied to the substrate, or slow to fill the recesses in the fine relief pattern in the mold after being brought into contact with the mold. Thus, the use of a viscous photocurable composition results in a low productivity in forming a cured product pattern by photo-nanoimprinting.

CITATION LIST

Patent Literature

PTL 1: Japanese Patent Laid-Open No. 2007-186570

SUMMARY OF INVENTION

Accordingly, the present invention provides a photocurable composition that can fill the mold at a high speed (filling speed) and high dry etching resistance.

According to an aspect of the present invention, a photocurable composition is provided which contains a polymerizable compound (A) and a non-polymerizable component (E) having a weight average molecular weight of 250 or less in a proportion in the range of 10% to 50% by weight relative to the total weight of the polymerizable compound (A) and the non-polymerizable component (E). The polymerizable compound (A) has a parameter $O_A = N_A/(N_{C,A} - N_{O,A})$. $N_A$ represents the total number of atoms in the molecule of the polymerizable compound (A). $N_{C,A}$ represents the number of carbon atoms in the molecule of the polymerizable compound (A), and $N_{O,A}$ represents the number of oxygen atoms in the molecule of the polymerizable compound (A). The non-polymerizable component (E) contains at least one non-polymerizable compound (X) including a photopolymerization initiator (B). The non-polymerizable compound (X) has a parameter $O_X = N_X/(N_{C,X} - N_{O,X})$. $N_X$ represents the total number of atoms in the molecule of the corresponding compound (X). $N_{C,X}$ represents the number of carbon atoms in the molecule of the corresponding compound (X), and $N_{O,X}$ represents the number of oxygen atoms in the molecule of the corresponding compound (X). The photocurable composition satisfies the following relational expressions (1) and (2):

$$O_A - O_E > 1.00 \quad (1); \text{ and}$$

$$O_{AE} < 3.40 \quad (2).$$

In these relational expressions, $O_E$ represents the molar fraction weighted average of the parameters OX of the at least one compound (X), and $O_{AE}$ represents the molar fraction weighted average of the parameters $O_A$ and $O_E$.

Further features of the present invention will become apparent from the following description of exemplary embodiments with reference to the attached drawings.

BRIEF DESCRIPTION OF DRAWINGS

FIG. 1A is a schematic sectional view illustrating a process for forming a cured product pattern according to an embodiment.

FIG. 1B is a schematic sectional view illustrating the process for forming a cured product pattern according to the embodiment.

FIG. 1C is a schematic sectional view illustrating the process for forming a cured product pattern according to the embodiment.

FIG. 1D is a schematic sectional view illustrating the process for forming a cured product pattern according to the embodiment.

FIG. 1E is a schematic sectional view illustrating the process for forming a cured product pattern according to the embodiment.

FIG. 1F is a schematic sectional view illustrating the process for forming a cured product pattern according to the embodiment.

FIG. 1G is a schematic sectional view illustrating the process for forming a cured product pattern according to the embodiment.

DESCRIPTION OF EMBODIMENTS

Exemplary embodiments of the present invention will now be described in detail with reference to the drawings. The invention is not however limited to the following embodiments. Also, the present invention includes any modification or variation that can be made within the scope and spirit of the invention on the basis of the knowledge of those skilled in the art.

Photocurable Composition

The photocurable composition according to an embodiment contains a polymerizable compound (A), which may be referred to as Component (A); and a photopolymerization initiator (B), which may be referred to as Component (B). The photocurable composition of the present embodiment may further contain a non-polymerizable compound (C), which may be referred to as Component (C). The photocurable composition can be suitably used for photo-nanoimprinting.

The term "cured product" used herein refers to a product of polymerization of the polymerizable compound performed for curing part or the entirety of the polymerizable compound. A cured product having a very small thickness relative to the area thereof may be particularly referred to as a cured film for the sake of emphasis. The cured product or cured film is not particularly limited in shape, and may have a pattern in the surface thereof.

The components the photocurable composition will now be described in detail.

Component (A): Polymerizable Compound

Component (A) is a polymerizable Compound. The polymerizable compound mentioned herein reacts with a polymerizing factor, such as radicals, produced from a photopolymerization initiator (Component (B)), thus forming a polymer film by chain reaction (polymerization reaction).

The polymerizable compound may be a radically polymerizable compound. The polymerizable compound, or Component (A), may be a single polymerizable compound or a combination of a plurality of polymerizable compounds.

The radically polymerizable compound may have at least one acryloyl group or methacryloyl group, and hence may be a (meth)acrylic compound. Accordingly, it is advantageous that the photocurable composition of the present embodiment contains a (meth)acrylic compound as one of the compounds constituting Component (A), and it is more advantageous that the (meth)acrylic compound is the main constituent of Component (A). Optimally, Component (A) is a (meth)acrylic compound. When a (meth)acrylic compound is the main constituent of Component (A), the (meth)acrylic compound accounts for 90% by weight or more of Component (A).

If the radically polymerizable compound is a combination of a plurality of compounds each having at least one acryloyl group or methacryloyl group, it is advantageous that the radically polymerizable compound contains a monofunctional (meth)acrylic monomer and a polyfunctional (meth) acrylic monomer. By combining a monofunctional (meth) acrylic monomer and a polyfunctional (meth)acrylic monomer, a strong cured film can be formed.

Examples of the monofunctional (meth)acrylic compound having an acryloyl or methacryloyl group include, but are not limited to, phenoxyethyl (meth)acrylate, phenoxy-2-methylethyl (meth)acrylate, phenoxyethoxyethyl (meth) acrylate, 3-phenoxy-2-hydroxypropyl (meth)acrylate, 2-phenylphenoxyethyl (meth)acrylate, 4-phenylphenoxy-ethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxy-ethyl (meth)acrylate, EO-modified phenoxy (meth)acrylate, PO-modified phenoxy (meth)acrylate, polyoxyethylene non-ylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth)acrylate, tetrahydrofurfuryl (meth) acrylate, butoxyethyl (meth)acrylate, ethoxydiethylene glycol (meth)acrylate, polyethylene glycol mono(meth) acrylate, polypropylene glycol mono(meth)acrylate, methoxyethylene glycol (meth)acrylate, ethoxyethyl (meth) acrylate, methoxypolyethylene glycol (meth)acrylate, methoxypolypropylene glycol (meth)acrylate, diacetone (meth)acrylamide, isobutoxymethyl(meth)acrylamide, N,N-dimethyl(meth)acrylamide, t-octyl(meth)acrylamide, dimethylaminoethyl (meth)acrylate, diethylaminoethyl (meth) acrylate, 7-amino-3,7-dimethyloctyl (meth)acrylate, N,N-diethyl(meth)acrylamide, and N,N-dimethylaminopropyl (meth)acrylamide.

Some monofunctional (meth)acrylic compounds are commercially available, and examples thereof include, but are not limited to, Aronix series M101, M102, M110, M111, M113, M117, M5700, TO-1317, M120, M150 and M156 (each produced by Toagosei); MEDOL 10. MIBDOL 10, CHDOL 10, MMDOL 30, MEDOL 30, MIBDOL 30, CHDOL 30, LA, IBXA, 2-MTA, HPA, and Biscoat series #150, #155, #158, #190, #192, #193, #220, #2000, #2100 and #2150 (each produced by Osaka Organic Chemical Industry); Light Acrylates BO-A. EC-A, DMP-A, THF-A, HOP-A, HOA-MPE, HOA-MPL, PO-A, P-200A, NP-4EA and NP-8EA, and epoxy ester M600A (each produced by Kyoeisha Chemical); KAYARAD TCI 10S, R-564 and R128H (each produced by Nippon Kayaku); NK esters AMP-10G and AMP-20G (each produced by Shin-Nakamura Chemical); FA-511A, 512A and 513A (each produced by Hitachi Chemical): PHE. CEA, PHE-2, PHE-4, BR-31. BR-31M and BR-32 (each produced by Dai-ichi Kogyo Seiyaku); VP (produced by BASF); and ACMO, DMAA and DMAPAA (each produced by Kohjin).

Examples of the polyfunctional (meth)acrylic compound having two or more acryloyl or methacryloyl groups include, but are not limited to, trimethylolpropane di(meth) acrylate, trimethylolpropane tri(meth)acrylate, EO-modified trimethylolpropane tri(meth)acrylate, PO-modified trimethylolpropane tri(meth)acrylate, EO, PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth) acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantanedimethanol di(meth)acrylate, tris(2-hydroxyethyl)isocyanurate tri(meth)acrylate, tris(acryloyloxy) isocyanurate, bis(hydroxymethyl)tricyclodecane di(meth) acrylate, dipentaerythritol penta(meth)acrylate, dipentaerythritol hexa(meth)acrylate. EO-modified 2,2-bis (4-((meth)acryloxy)phenyl)propane, PO-modified 2,2-bis(4-((meth)acryloxy)phenyl)propane, and EO, PO-modified 2,2-bis(4-((meth)acryloxy)phenyl)propane.

The polyfunctional (meth)acrylic compound is commercially available, and example thereof include, but are not limited to, Yupimer UV SA1002 and Yupimer UV SA2007 (each produced by Mitsubishi Chemical); Biscoat series #195, #230, #215, #260, #335HP, #295, #300, #360. #700, GPT and 3PA (each produced by Osaka Organic Chemical Industry); Light Acrylates 4EG-A, 9EG-A, NP-A, DCP-A, BP-4EA, BP-4PA, TMP-A, PE-3A, PE-4A and DPE-6A (each produce by Kyoeisha Chemical); KAYARAD PET-30, TMPTA. R-604, DPHA, DPCA-20, -30, -60 and -120, HX-620. D-310, and D-330 (each produced by Nippon Kayaku); Aronix series M208, M210, M215, M220, M240, M305, M309, M310, M315, M325 and M400 (each produced by Toagosei); and Ripoxy VR-77, Ripoxy VR-60 and Ripoxy VR-90 (each produced by Showa Denko).

In the above-cited compounds, (meth)acrylate refers to an acrylate or the methacrylate containing the same alcohol residue as the acrylate. Also, a (meth)acryloyl group refers to an acryloyl group or the methacryloyl group containing the same alcohol residue as the acryloyl group. EO represents ethylene oxide, and EO-modified compound A is a compound in which the (meth)acrylic acid residue and alcohol residue of compound A are bound to each other with an ethylene oxide block structure therebetween. PO represents propylene oxide, and PO-modified compound B is a compound in which the (meth)acrylic acid residue and alcohol residue of compound B are bound to each other with a propylene oxide block structure therebetween.

Component (B): Photopolymerization Initiator

Component (B) consists of at least one photopolymerization initiator.

The photopolymerization initiator used in the present embodiment senses light having a specific wavelength to produce the polymerizing factor (radicals) mentioned above. More specifically, the photopolymerization initiator is a radical generator that produces radicals with light (radiations, such as infrared radiation, visible light radiation, ultraviolet radiation, far ultraviolet radiation, X-ray radiation, and electron beams and other charged particle radiation).

Component (B) may be a single photopolymerization initiator or a combination of a plurality of photopolymerization initiators.

Exemplary radical generators include, but are not limited to, substituted or unsubstituted 2,4,5-triarylimidazole dimers, such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, and 2-(o- or p-methoxyphenyl)-4,5-diphenylimidazole dimer; benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-aminoaromatic ketone derivatives, such as 2-benzyl-2-dimethylamino-1-(4-morpholinophenyl)-butanone-1 and 2-methyl-1-[4-(methylthio)phenyl]-2-morpholino-propane-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin and benzoin derivatives, such as methylbenzoin, ethylbenzoin, and propylbenzoin; benzyl derivatives such as benzyl dimethyl ketal; acridine derivatives, such as 9-phenylacridine and 1,7-bis(9,9'-acridinyl)heptane; N-phenylglycine and N-phenylglycine derivatives; acetophenone and acetophenone derivatives, such as 3-methylacetophenone, acetophenone benzyl ketal, 1-hydroxycyclohexyl phenyl ketone, and 2,2-dimethoxy-2-phenylacetophenone; thioxanthone and thioxanthone derivatives, such as diethylthioxanthone, 2-isopropylthioxanthone, and 2-chlorothioxanthone; acylphosphine oxide derivatives, such as 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethylpentylphosphine oxide; oxime ester derivatives, such as 1,2-octanedione, 1-[4-(phenylthio)phenyl-,2-(o-benzoyloxime)], ethanone, 1-[9-ethyl-6-(2-methylbenzoyl)-9H-carbazole-3-yl]-, 1-(O-acetyloxime); and xanthone, fluorenone, benzaldehyde, fluorene, anthraquinone, triphenylamine, carbazole, 1-(4-isopropylphenyl)-2-hydroxy-2-methylpropane-1-one, and 2-hydroxy-2-methyl-1-phenylpropane-1-one.

The radical generator may be commercially available, and examples thereof include, but are not limited to, Irgacure series 184, 369, 651, 500, 819, 907, 784 and 2959, CGI-1700, -1750 and -1850, CG24-61, Darocur series 1116 and 1173, Lucirin TPO, LR 8893, and LR 8970 (each produced by BASF): and Ubecryl P36 (produced by UCB).

Among those, acylphosphine oxide-based photopolymerization initiators are suitable as Component (B). Among the above-cited photopolymerization initiators, 2,4,6-trimethylbenzoyldiphenylphosphine oxide, bis(2,4,6-trimethylbenzoyl)phenylphosphine oxide, and bis(2,6-dimethoxybenzoyl)-2,4,4-trimethyl pentyl phosphine oxide are acylphosphine oxide-based compounds.

The proportion of Component (B), or the photopolymerization initiator, in the photocurable composition may be in the range of 0.1% to 50% by weight relative to the total weight of Components (A) and (B), and Component (C) that will be described later, that is, the total weight of all the constituents except the solvent. Desirably, it is in the range of 0.1% to 20% by weight, and more desirably in the range of more than 10% to 20% by weight.

When the proportion of Component (B) is 0.1% by weight or more relative to the total weight of Components (A), (B) and (C), the photocurable composition can be cured at a high speed; hence the reaction efficiency of the compound can be increased. When the proportion of Component (B) is 50% by weight or less relative to the total weight of Components (A), (B) and (C), the photocurable composition can form a cured film having a certain degree of mechanical strength.

Component (C): Non-polymerizable Compound

The photocurable composition of the present embodiment may contain a non-polymerizable compound as Component (C) in addition to Components (A) and (B), depending on purpose, within a range in which the intended effects of the present invention are produced. Desirably, Component (C) is nonvolatile. The term "nonvolatile" used herein means not vaporizing or dispersing readily into the air at room temperature under normal pressure. The term "volatile" used herein means vaporizing or dispersing readily into the air in a temperature range of room temperature to 150° C. under normal pressure. Such Component (C) may be a compound that does not have a polymerizable functional group such as (meth)acryloyl and is not able to sense light having a specific wavelength to produce the above-mentioned polymerizing factors (radicals). Examples of Component (C) include a sensitizer, a hydrogen donor, an internal releasing agent, a surfactant, an antioxidant, a polymer component and other additives. Component (C) may be a combination of a plurality of these compounds.

The sensitizer is optionally added to promote the polymerization reaction or increase reaction conversion rate. The sensitizer may be a sensitizing dye.

The sensitizing dye is a compound that is excited by absorbing light having a specific wavelength and interacts with the photopolymerization initiator, or Component (B). The phrase "interacts with" mentioned here implies that, for example, energy or electrons transfer from the excited sensitizing dye to the photopolymerization initiator, or Component (B).

Examples of the sensitizing dye include, but are not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt-based dyes, merocyanine dyes, quinoline dyes, styryl quinoline dyes, ketocoumarin dyes, thioxanthene dyes, xanthene dyes, oxonol dyes, cyanine dyes, rhodamine dyes, and pyrylium salt-based dyes.

These sensitizing dyes may be used singly or in combination.

The hydrogen donor is a compound that can react with an initiator radical generated from the photopolymerization initiator that is Component (B) or a chain end radical, thereby producing a more reactive radical. It is advantageous that the hydrogen donor be added when the photopolymerization initiator, or Component (B), is a photoradical generator.

Examples of the hydrogen donor include, but are not limited to, amine compounds, such as n-butylamine, di-n-butylamine, tri-n-butylphosphine, allylthiourea, s-benzylisothiuronium-p-toluene sulfonate, triethylamine, diethylaminoethyl methacrylate, triethylenetetramine, 4,4'-bis(dialkylamino)benzophenone, ethyl N,N-dimethylaminobenzate, isoamyl N,N-dimethylaminobenzoate, pentyl 4-(dimethylamino)benzoate, triethanolamine, and N-phenylglycine; and mercapto compounds, such as 2-mercapto-N-phenylbenzoimidazole and mercaptopropionic acid esters.

These hydrogen donors may be used singly or in combination. The hydrogen donor may have a function as a sensitizer.

An internal releasing agent may be added to the photocurable composition in order to reduce the interfacial bonding strength between a mold and a resist, that is, the force for removing the mold in a mold-releasing step described later.

The internal releasing agent mentioned herein is a release agent that has been added to the photocurable composition before applying or placing the photocurable composition.

The internal releasing agent may be a surfactant, such as a silicone surfactant, a fluorosurfactant, or a hydrocarbon surfactant. In the present embodiment, the internal releasing agent is not polymerizable.

The fluorosurfactant may be a polyalkylene oxide (such as polyethylene oxide or polypropylene oxide) adduct of an alcohol having a perfluoroalkyl group, or a polyalkylene oxide (such as polyethylene oxide or polypropylene oxide) adduct of perfluoropolyether. The fluorosurfactant may have a hydroxy, alkoxy, alkyl, amino or thiol group or the like in a part (for example, a terminal group) of the molecule.

The fluorosurfactant may be a commercially available product. Examples of the commercially available fluorosurfactant include Megafac series F-444, TF-2066, TF-2067 and TF-2068 (each produced by DIC); Fluorad series FC-430 and FC-431 (each produced by Sumitomo 3M); Surflon S-382 (produced by AGC); EFTOP EF-122A, 122B, 122C, EF-121, EF-126, EF-127 and MF-100 (each produced by Tochem Products); PF-636, PF-6320, PF-656 and PF-6520 (each produced by OMNOVA Solutions); Unidyne series DS-401, DS-403 and DS-451 (each produced by Daikin Industries); and Ftergent series 250, 251, 222F and 208G (each produced by Neos).

The internal releasing agent may be a hydrocarbon surfactant.

The hydrocarbon surfactant may be an alkyl alcohol polyalkylene oxide adduct produced by adding an alkylene oxide having a carbon number of 2 to 4 to an alkyl alcohol having a carbon number of 1 to 50.

Examples of the alkyl alcohol polyalkylene oxide adduct include methyl alcohol polyethylene oxide adduct, decyl alcohol polyethylene oxide adduct, lauryl alcohol polyethylene oxide adduct, cetyl alcohol polyethylene oxide adduct, stearyl alcohol polyethylene oxide adduct, and stearyl alcohol polyethylene oxide/polypropylene oxide adduct. The terminal group of the alkyl alcohol polyalkylene oxide adduct is not limited to the hydroxy group, which is formed when a polyalkylene oxide is simply added to an alkyl alcohol. The hydroxy group may be substituted with a polar functional group, such as carboxy, amino, pyridyl, thiol, or silanol, or a hydrophobic functional group, such as alkyl or alkoxy.

A commercially available alkyl alcohol polyalkylene oxide adduct may be used. Examples thereof include polyoxyethylene methyl ethers (methyl alcohol ethylene oxide adducts) BLAUNON series MP-400, MP-550 and MP-1000 (each produced by Aoki Oil Industrial); polyoxyethylene decyl ethers (decyl alcohol ethylene oxide adducts) FINE-SURF series D-1303, D-1305, D-1307 and D-1310 (each produced by Aoki Oil Industrial); polyoxyethylene lauryl ether (lauryl alcohol ethylene oxide adduct) BLAUNON EL-1505 (produced BY Aoki Oil Industrial); polyoxyethylene cetyl ethers (cetyl alcohol ethylene oxide adducts) BLAUNON series CH-305 and CH-310 (each produced by Aoki Oil Industrial); polyoxyethylene stearyl ethers (stearyl alcohol ethylene oxide adducts) BLAUNON series SR-705, SR-707, SR-715, SR-720, SR-730 and SR-750 (each produced by Aoki Oil Industrial); random copolymer type polyoxyethylene/polyoxypropylene stearyl ethers BLAUNON series SA-50/50 1000R and SA-30/70 2000R (each produced by Aoki Oil Industrial); polyoxyethylene methyl ether Pluriol A760E (produced by BASF); and polyoxyethylene alkyl ethers EMULGEN series (produced by Kao).

Among the above-cited hydrocarbon surfactants, alkyl alcohol polyalkylene oxide adducts, particularly, long chain alkyl alcohol polyalkylene oxide adducts, are suitable as the internal releasing agent.

Internal releasing agent may be used singly or in combination.

The proportion of Component (C), or the non-polymerizable compound, in the photocurable composition may be in the range of 0% to 50% by weight relative to the total weight of Components (A), (B) and (C), that is, the total weight of all the constituents except the solvent. Desirably, it is in the range of 0.1% to 50% by weight, and more desirably in the range of 0.1% to 20% by weight.

When the proportion of Component (C) is 50% by weight or less relative to the total weight of Components (A), (B) and (C), the photocurable composition can form a cured film having a certain degree of mechanical strength.

Ohnishi Parameter of Each Component

It is known that the dry etching rate V of a composition has the following relationship (3) with the total number N of atoms in the composition, the total number $N_C$ of carbon atoms in the composition, and the total number $N_O$ of oxygen atoms in the composition (J. Electrochem. Soc., 130, p, 143 (1983)).

$$V \propto N/(N_C - N_O) \quad (3)$$

The $N/(N_C - N_O)$ value is known as "Ohnisi parameter". For example, PTL 1 discloses that photocurable compositions can be resistant to dry etching by using a polymerizable compound having a low Ohnishi parameter.

Relational expression (3) suggests that an organic compound containing a smaller number of oxygen atoms or containing a larger number of aromatic ring structures or alicyclic structures has a lower Ohnishi parameter and is accordingly more resistant to dry etching.

However, polymerizable compounds such as (meth)acrylic compounds tend to have high Ohnishi parameters because the (meth)acrylic group has two oxygen atoms. For example, the Ohnishi parameter of benzyl acrylate (BZA), which is relatively low among the monofunctional (meth)acrylic compounds, is 2.75. Also, for example, the Ohnishi parameter of dimethyloltricyclodecane diacrylate (DCPDA), which is relatively low among the polyfunctional (meth)acrylic compounds, is 3.29.

It may be effective in reducing the Ohnishi parameter of a (meth)acrylic compound to increase the number of aromatic rings in the (meth)acrylic compound. Unfortunately, increasing the number of aromatic rings increases the molecular weight of the (meth)acrylic compound and accordingly increases the viscosity of the photocurable composition.

In the photocurable composition of the present embodiment, accordingly, the constituents in the photocurable composition other than the polymerizable compound (A), that is, the photopolymerization initiator and the non-polymerizable compounds optionally added as Component (C) have low Ohnishi parameters. In the following description, Components (B) and (C) having low Ohnishi parameters are collectively referred to as the non-polymerizable component (E). "Non-polymerizable Component (E)" used herein consists of compounds having no polymerizable functional group, such as the (meth)acryloyl group.

The non-polymerizable component (E) has a weight average molecular weight of 250 or less. In general, the lower the molecular weights of the compounds in a composition, the lower the viscosity of the composition. By controlling the weight average molecular weight of Component (E) to 250 or less, therefore, the viscosity of the photocurable composition can be low.

The presence of the non-polymerizable component as Component (E) reduces the Ohnishi parameter of the photocurable composition as a whole to increase the dry etching resistance without increasing the viscosity much. Table 1 shows the photopolymerization initiators (Component (B)) and non-polymerizable compounds (Component (C)) suitable as Component (E).

TABLE 1

| Component | Compound | Commercially available product | Manufacturer | Ohnishi parameter | Molecular weight |
|---|---|---|---|---|---|
| B | 2,4,6-Trimethylbenzoyl-diphenylphoshine oxide | Lucirin TPO | BASF | 2.30 | 348.37 |
| | 1,2-Octanedione, 1-[4-(phenylthio)phenyl-, 2-(o-benzoyloxime)] | Irgacure OXE 01 | BASF | 2.46 | 445.57 |
| | Ethanone, 1-[9-ethyl-6-(2-methylbenzoyl)-9H-carbazole3-yl]-, 1-(O-acetyloxime) | Irgacure OXE 02 | BSAF | 2.39 | 412.48 |
| | Benzophenone | — | Tokyo Chemical Industry | 2.00 | 182.22 |
| | 2-Isopropylthioxanthone | — | Tokyo Chemical Industry | 2.13 | 254.35 |
| | 4-Phenylbenzophenone | — | Tokyo Chemical Industry | 1.89 | 258.31 |
| C | Biphenyl | — | Tokyo Chemical Industry | 1.83 | 154.21 |
| | p-Terphenyl | — | Tokyo Chemical Industry | 1.78 | 230.30 |

In the photocurable composition of the present embodiment, the proportion of the non-polymerizable component (E) consisting of compounds having low Ohnishi parameters is in the range of 10% to 50% by weight relative to the total weight of Components (A), (B) and (C), that is, relative to the total weight of all the compounds except the solvent. More desirably, it is in the range of 15% to 50% by weight. When the proportion of the non-polymerizable component (E) is 10% by weight or more relative to the total weight of Components (A) and (E), the Ohnishi parameter of the photocurable composition can be reduced as a whole, and accordingly, the dry etching resistance of the composition can be increased. Also, when the proportion of the non-polymerizable component (E) is 50% by weight or less relative to the total weight of Components (A) and (E), the photocurable composition can form a cured film having a certain degree of mechanical strength.

In addition, the photocurable composition of the present embodiment satisfies the following relational expressions (1) and (2):

$$O_A - O_E > 1.00 \quad (1); \text{ and}$$

$$O_{AE} < 3.40 \quad (2).$$

Such a photocurable composition can be highly resistant to dry etching (exhibit low dry etching rate).

In the relational expressions, $O_A$ represents the Ohnishi parameter of the polymerizable compound (A) expressed by $O_A = N_A/(N_{C,A} - N_{O,A})$. $N_A$ represents the total number of atoms in the polymerizable compound (A). $N_{C,A}$ represents the number of carbon atoms in the polymerizable compound (A), and $N_{O,A}$ represents the number of oxygen atoms in the polymerizable compound (A).

$O_E$ is the molar fraction weighted average of the Ohnishi parameters $O_X$ of compounds (X) contained in the non-polymerizable component (E). Hence, $O_X = N_X/(N_{C,X} - N_{O,X})$. $N_X$ represents the total number of atoms in the molecule of compound (X), $N_{C,X}$ represents the number of carbon atoms in the molecule of compound (X), and $N_{O,X}$ represents the number of oxygen atoms in the molecule of compound (X).

Fox example, in the case wherein the non-polymerizable component (E) contains $M_{X1}$ mol of compound (X1) and $M_{X2}$ mol of compound (X2), the Ohnishi parameter OE of the non-polymerizable component (E) is $OE = (M_{X1}O_{X1} + M_{X2}O_{X2})/(M_{X1} + M_{X2})$.

In the equation. $O_{X1} = N_{X1}/(N_{C,X1} - N_{O,X1})$ holds true. $N_{X1}$ represents the total number of atoms in the molecule of compound (X1), $N_{C,X1}$ represents the number of carbon atoms in the molecule of compound (X1), and $N_{O,X1}$ represents the number of oxygen atoms in the molecule of compound X1).

In the equation, $O_{X2} = N_{X2}/(N_{C,X2} - N_{O,X21})$ holds true. $N_{X2}$ represents the total number of atoms in the molecule of compound (X2), $N_{C,X2}$ represents the number of carbon atoms in the molecule of compound (X2), and $N_{O,X2}$ represents the number of oxygen atoms in the molecule of compound X2).

If Component (A) contains a plurality of polymerizable compounds, the Ohnishi parameter $O_A$ is molar fraction weighted average of the Ohnishi parameters of the plurality of polymerizable compounds.

In the photopolymerizable composition of the present embodiment, the Ohnishi parameter $O_E$ of Component (E) (Components (B) and (C)) is desirably less than 2.20. Such a photopolymerizable composition can exhibit low Ohnishi parameter as a whole, and be accordingly resistant to dry etching.

Advantageously, at least either Component (B) or Component (C) in Component (E) is composed of only compounds having molecular weights of 500 or less. More advantageously, each of the Components (B) and (C) in Component (E) is composed of only compounds having molecular weights of 500 or less.

Advantageously, Component (E) contains at least one compound selected from the group consisting of benzophenone, biphenyl and p-terphenyl. Since the molecular weights of these compounds are 250 or less as shown in Table 1, the weight average molecular weight of Component (E) can be 250 or less.

Proportions of Components (A) and (B) can be measured by infrared spectroscopy, ultraviolet-visible spectroscopy, pyrolysis gas chromatography mass spectrometry or the like of the photocurable composition or a cured film of the photocurable composition. Even when the photocurable composition contains Component (C), the proportions of Components (A), (B) and (C) can be measured by analysis performed in the same manner.

Component (D): Solvent

The photocurable composition of the present embodiment may further contain a solvent as Component (D). Any solvent may be used as Component (D) as long as it can dissolve Components (A), (B) and (C). Advantageously, Component (D) is a volatile solvent having a boiling point in the range of 80° C. to 200° C. under normal pressure. More desirably, the solvent or Component (D) has at least one structure of an ester structure, a ketone structure, a hydroxy group, and an ether structure. Examples of the solvent include propylene glycol monomethyl ether acetate, propylene glycol monomethyl ether, cyclohexanone, 2-heptanone, γ-butyrolactone, and ethyl lactate. These may be used singly or in combination.

The content of the solvent in the photocurable composition can be adjusted according to the viscosity of the mixture of Components (A), (B) and (C), and the coating method of the photopolymerizable composition, and the thickness of the cured film to be formed, or other factors.

If the photocurable composition is applied onto a substrate by an ink jet method, however, it is advantageous that the photocurable composition do not substantially contain a volatile solvent. The phrase "do not substantially contain a volatile solvent" mentioned here means that the photocurable composition does not contain volatile solvents other than those inevitably contained as impurities. For example, the content of the volatile solvent in the photocurable composition may be 3% by weight or less, such as 1% by weight or less. The photocurable composition not containing a volatile solvent does not require a baking step for removing the solvent after being applied onto a substrate, thus being advantageous for simplifying the process.

If the photocurable composition of the present embodiment is applied onto a substrate by spin coating or the like, the photocurable composition may contain a volatile solvent as Component (D). The solvent in the photocurable composition reduces the viscosity of the photocurable composition, and is thus advantageous in the case of forming a coating film of the photocurable composition to a thickness of, for example, 500 nm or less.

Temperature for Preparing Photocurable Composition

For preparing the photocurable composition of the present embodiment, at least Components (A) and (B) are mixed and dissolved in each other at a temperature in the range of 0° C. to 100° C. If Component (C) is added, it is mixed and dissolved under the same conditions.

Viscosity of Photocurable Composition

The mixture of the compounds of the photocurable composition other than the solvent (Component (D)) may have a viscosity in the range of 1 mPa·s to 100 mPa·s at 25° C. Desirably, it is in the range of 1 mPa·s to 50 mPa·s, such as 1 mPa·s to 6 mPa·s.

The photocurable composition having a viscosity of 100 mPa·s or less can fill the recesses of the fine pattern in the mold without taking a long time. The use of the photocurable composition enables photo-nanoimprinting with a high productivity. Also, filling failure is unlikely to occur which causes a defect in the resulting pattern.

The photocurable composition having a viscosity of 1 mPa·s or more is more likely to be applied uniformly on the substrate. In addition, such a photocurable composition does not easily flow out of the mold.

Surface Tension of Photocurable Composition

The mixture of the constituents of the photocurable composition other than the solvent (Component (D)) may have a surface tension in the range of 5 mN/m to 70 mN/m at 23° C. Desirably, it is in the range of 7 mN/m to 35 mN/m, such as 10 mN/m to 32 mN/m. The photocurable composition having a surface tension of 5 mN/m or more can fill the recesses of the fine pattern in the mold without taking a long time.

Also, the photocurable composition having a surface tension of 70 mN/m or less can form a photo-cured film having a smooth surface.

Impurities in Photocurable Composition

Desirably, the photocurable composition contains as little impurities as possible. The impurities mentioned herein refer to constituents other than Components (A), (B), (C) and (D).

It is therefore desirable that the photocurable composition have been purified. For example, filtration through a filter is advantageous for purification.

In this instance, more specifically, the mixture of Components (A) and (B) and optional Component (C) may be filtered through a filter having a pore size in the range of 0.001 µm to 5.0 µm. This filtration may be performed in a plurality of steps or repeated several times. The filtrate may be further filtered. A plurality of filters having different pore sizes may be used. The filter may be made of, but not limited to, polyethylene, polypropylene, fluororesin, or nylon.

Impurities such as particulate matter can be removed from the photocurable composition by such filtration. Thus, unexpected defects can be prevented which result from unevenness caused by particulate matter or other impurities in the cured film formed by curing the photocurable composition.

If the photocurable composition of the present embodiment is used for manufacturing a semiconductor integrated circuit, it is desirable to avoid the contamination with metallic impurities containing a metal atom as much as possible in order to prevent the metallic impurities from interfering with the operation of the product. In this instance, the concentration of metallic impurities in the photocurable composition is desirably 10 ppm or less, and more desirably 100 ppb or less.

Formation of Cured Product Pattern

A method for forming a cured product pattern (cured film having a pattern) according to an embodiment will now be described. FIGS. 1A to 1G are schematic sectional views illustrating a method for forming a cured product pattern according to the embodiment.

The method for forming a cured product pattern of the present embodiment includes a first step (1) of applying the photocurable composition of the above-described embodiment, a second step (2) of bringing the photocurable composition into contact with a mold, a third step (4) of irradiating the photocurable composition with light to yield a cured product, and a fourth step (5) of separating the cured product from the mold after the third step.

The cured product pattern formed by the method of the present embodiment may measure in the range of 1 nm to 10 mm, such as 10 nm to 100 µm. In general, methods for forming nanometer scale (1 nm to 100 nm) patterns (having a relief structure) using light are called photo-nanoimprinting. This method for forming a cured product pattern incorporates a photo-nanoimprinting technique.

The process steps of the method will now be described.

Application Step (1)

In this step (application step), the photocurable composition 101 is applied (placed) onto the substrate 102, as shown in FIG. 1A.

The substrate 102, or processing substrate, to which a photocurable composition 101 will be applied, is typically silicon wafer. For forming an imprinting mold using the method of the present embodiment, a quartz substrate may be used as the substrate 102. In this instance, a quartz substrate provided with a metal compound layer (hard mask material layer) thereon may be used as the substrate 102.

The substrate 102 is however not limited to the silicon wafer or the quartz substrate. The substrate 102 may be arbitrarily selected from among substrates used for semiconductor devices, such as substrates made of aluminum, titanium-tungsten alloy, aluminum-silicon alloy, aluminum-copper-silicon alloy, silicon oxide, or silicon nitride. The substrate 102 (processing substrate) may be subjected to surface treatment for increasing the adhesion with the photocurable composition, such as silane coupling treatment, silazane treatment, or forming an organic thin film thereon.

In the present embodiment, the photocurable composition 101 may be applied onto the substrate 102 by, for example, an ink jet method, dip coating, air knife coating, curtain coating, a wire barcode method, gravure coating, extrusion coating, spin coating, or a slit scan method. For a photo-nanoimprinting method, an ink jet method is particularly suitable. The thickness of the applied photocurable composition (to which a pattern will be transferred) depends on use, and may be, for example, in the range of 0.01 µm to 100.0 µm.

Mold Contact Step (2)

Subsequently, the photocurable composition 101 applied in the preceding application step is brought into contact with a mold 104 having an original pattern to be transferred into an intended pattern, as shown in FIG. 1B (b-1). Thus the recesses of the fine pattern in the surface of the mold 104 are filled with the photocurable composition 101, so that a coating film 106 filling the fine pattern of the mold 104 is formed (FIG. 1B (b-2)).

Advantageously, the mold 104 is made of an optically transparent material in view of the subsequent irradiation step. Examples of the material of the mold 104 include glass, quartz, optically transparent resins, such as polymethyl methacrylate (PMMA) and polycarbonate, transparent metal films formed by vapor deposition, soft films of polydimethylsiloxane or the like, photo-cured films, and metal films. If an optically transparent resin is used as the material of the mold 104, the optically transparent resin is a material insoluble in any constituent of the photocurable composition 101. Quartz is most suitable as the material of the mold 104 because it has a small thermal expansion coefficient and is accordingly unlikely to deform the pattern.

The fine pattern in the surface of the mold 104 may have a height in the range of 4 nm to 200 nm and each portion of the pattern may have an aspect ratio in the range of 1 to 10.

The mold 104 may be surface-treated before the mold contact step so that the mold 104 can be easily removed from the photocurable composition 101. For the surface treatment, a releasing agent may be applied to the surface of the mold 104. Examples of the releasing agent to be applied to the surface of the mold 104 include silicone releasing agents, fluorine-based releasing agents, hydrocarbon releasing agents, polyethylene-based releasing agents, polypropylene-based releasing agents, paraffin releasing agents, montanic releasing agents, and carnauba releasing agents. Commercially available releasing agents that are the type of being applied, such as Optool DSX produced by Daikin Industries, can be advantageously used. Releasing agents may be used singly or in combination. Fluorine-based and hydrocarbon releasing agents are particularly suitable.

When the photocurable composition 101 is brought into contact with the mold 104 as shown in FIG. 1B (b-1), the pressure applied to the photocurable composition 101 is typically, but not limited to, in the range of 0 MPa to 100 MPa. Desirably, the pressure is in the range of 0 MPa to 50 MPa, more desirably in the range of 0 MPa to 30 MPa, such as 0 MPa to 20 MPa.

The period of time for which the mold 104 is kept in contact with the photocurable composition 101 is not particularly limited. For example, it may be in the range of 0.1 s to 600 s. Desirably, it is in the range of 0.1 s to 300 s, more desirably in the range of 0.1 s to 180 s, such as 0.1 s to 120 s.

Although the mold contact step may be performed in any atmosphere, such as an atmosphere of air, a reduced pressure or an inert gas, it is advantageous that the mold contact step is performed in an atmosphere of reduced pressure or an inert gas, from the viewpoint of preventing oxygen or moisture from affecting the curing reaction. Inert gases that can be used in this step include nitrogen, carbon dioxide, helium, argon, chlorofluorocarbon gases, and mixtures of these gases. When the mold contact step is performed in an atmosphere of a specific gas, including the case of air, the pressure of the gas may be in the range of 0.0001 to 10 atmospheres.

The mold contact step may be performed in an atmosphere containing a condensable gas (hereinafter referred to as condensable gas atmosphere). The condensable gas mentioned herein is condensed into liquid by capillary force generated when the gas fills the recesses of the fine pattern in the mold 104 and the gap between the mold and the substrate. The condensable gas is in the form of gas in the atmosphere before the photocurable composition 101 (to which the pattern will be transferred) is brought into contact with the mold 104 in the mold contact step (FIG. 1B (b-1)).

In the mold contact step performed in a condensable gas atmosphere, the gas having filled the recesses of the fine pattern is turned into liquid, thereby removing air bubbles. Consequently, the photocurable composition can satisfactorily fill the recesses of the mold. The condensable gas may be dissolved in the photocurable composition 101.

The boiling point of the condensable gas is lower than or equal to the temperature of the atmosphere and is otherwise not limited. For example, it may be in the range of −10° C. to 23° C. such as 10° C. to 23° C. When the condensable gas has a boiling point in this range, the mold can be satisfactorily filled.

The vapor pressure of the condensable gas at the temperature of the atmosphere in the mold contact step is lower than or equal to the pressure the mold applies in the mold contact step and may be in the range of 0.1 MPa to 0.4 MPa. When the condensable gas has a boiling point in this range, the mold can be satisfactorily filled. If the vapor pressure is higher than 0.4 MPa at the temperature of the atmosphere, air bubbles are unlikely to be removed as expected. In contrast, if the vapor pressure is lower than 0.1 MPa at the temperature of the atmosphere, decompression is required. This makes the apparatus complicated.

The temperature of the atmosphere for the mold contact step may be in the range of, but is not limited to, 20° C. to 25° C.

Examples of the condensable gas include fluorocarbons (FCs) including chlorofluorocarbons (CFCs), such as trichlorofluoromethane; hydrofluorocarbons (HFCs) and hydrochlorofluorocarbons (HCFCs), such as 1,1,1,3,3-pentafluoropropane ($CHF_2CH_2CF_3$, HFC-245fa, PFP); and hydrofluoro ethers (HFEs), such as pentafluoroethyl methyl ether ($CF_3CF_2OCH_3$, HFE-245mc).

From the viewpoint of satisfactorily filling the mold at a temperature of 20° C. to 25° C. in the atmosphere in the mold contact step, advantageous are 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.) and pentafluoroethyl methyl ether. Particularly advantageous is 1,1,1,3,3-pentafluoropropane because of having high safety.

Condensable gases may be used singly or in combination. The condensable gas may be mixed with a non-condensable gas, such as air, nitrogen, carbon dioxide, helium, or argon. Helium is suitable as the non-condensable gas to be mixed with the condensable gas from the viewpoint of satisfactorily filling the mold. Helium can pass through the mold 104. When the gas (condensable gas and helium), together with the coating film 106, has filled the recesses of the fine pattern in the mold 104, helium passes through the mold, while the condensable gas turns into liquid.

Alignment Step (3)

In the subsequent step, at least either position of the mold or the processing substrate is adjusted so that alignment marks 105 on the mold and alignment marks 103 on the processing substrate are aligned with each other, if necessary, as shown in FIG. 1C.

Irradiation Step (4)

Subsequently, the contact portion between the photocurable composition 101 and the mold 104 is irradiated with light through the mold 104 with the mold and the substrate aligned, as shown in FIG. 1D. More specifically, the coating film 106 filling the pattern in the mold 104 is irradiated with light 107 through the mold 104 (FIG. 1D (d-1)). Thus the portions of the coating film 106 filling the fine pattern of the mold 104 are cured into a cured product 108 by light (FIG. 1D (d-2)).

The light irradiating the photocurable composition 101 forming the coating film 106 filling the fine pattern of the mold 104 is appropriately selected according to the wavelength to which the photocurable composition 101 is sensitive. Examples of such light include ultraviolet light having a wavelength of 150 nm to 400 nm, X-ray radiation, and electron beams.

Among these, ultraviolet light is more suitable as the light irradiating the photocurable composition 101 (irradiation light 107). This is because many of the commercially available curing agents (photopolymerization initiators) are sensitive to ultraviolet light. Light sources that emit ultraviolet light include high-pressure mercury-vapor lamps, ultrahigh-pressure mercury-vapor lamps, low-pressure mercury-vapor lamps, Deep-UV lamps, carbon arc lamps, chemical lamps, metal halide lamps, xenon lamps, KrF excimer lasers, ArF excimer lasers, and F2 excimer lasers.

An ultrahigh-pressure mercury-vapor lamp is advantageous. The number of light sources may be one or more. The coating film 106 filling the fine pattern of the mold may be irradiated in part or entirety.

The irradiation may be performed over the entire region of the substrate intermittently several times or continuously. Alternatively, region A may be irradiated in a first stage of irradiation, and region B, different from region A, may be irradiated in a second stage of the irradiation.

Mold-Releasing Step (5)

Subsequently, the mold 104 is removed from the cured product 108. At this time, a cured product pattern 109 having a specific pattern has been formed on the substrate 102.

In the mold-releasing step, the cured product 108 is separated from the mold 104, as shown in FIG. 1E, to yield a cured product pattern 109 having a pattern reverse to the fine pattern of the mold 104.

In the case of performing the mold contact step in a condensable gas atmosphere, the condensable gas evaporates as the pressure at the interface between the cured product 108 and the mold 104 is reduced by removing the mold 104 from the cured product 108. This helps remove the mold 104 with a low force.

How to remove the mold 104 from the cured product 108, including the conditions for mold releasing, is not particularly limited as long as the cured product 108 is not physically damaged. For example, the mold 104 may be moved so as to go away from the work substrate 102 fixed, or the substrate 102 may be moved so as to go away from the mold 104 fixed. Alternatively, the mold 104 and the substrate 102 may be drawn in the opposite directions so as to separate from each other.

The above-described process including the steps of (1) to (5) forms a cured film having a desired relief pattern derived from the relief pattern in the mold 104 in a desired position. The resulting cured film may be used as, for example, an optical member such as a Fresnel lens or a diffraction grating, or a part of such an optical member. In this instance, the optical member includes at least the substrate 102 and the cured product pattern 109 on the substrate 102.

In the method of the present embodiment, a repeating unit (shot) including steps (1) to (5) may be repeated several times for the same substrate 102. By repeating the repeating unit (shot) including steps (1) to (5) several times, a cured product pattern can be formed which has a plurality of desired patterns based on the relief pattern of the mold 104 in a desired region.

Unwanted Portion Removal Step (6) of Removing Part of Cured Film

The cured product pattern formed through Step (5) or the mold-releasing step has a specific pattern, and which may remain in a region other than the region in which the pattern should be formed (hereinafter such a portion of the cured film may be referred to as an unwanted portion). In this instance, the unwanted portion of the cured product pattern is removed is removed as shown in FIG. 1F. Consequently, a cured product pattern 110 having a desired pattern (formed based on the relief pattern of the mold 104) is formed.

In this step, the unwanted portion of the cured film in the recesses of the cured product pattern 109 can be removed by, for example, etching so as to expose the surface of the substrate 102 in the recesses of the cured product pattern 109.

For removing the unwanted portion of the cured product pattern 109 by etching, any technique may be applied without particular limitation, and a known technique, such as dry etching, may be performed. For the dry etching, a known dry etching apparatus can be used. The source gas used for the dry etching is appropriately selected according to the elemental composition of the cured film to be etched, and examples thereof include halogen-containing gases, such as $CF_4$, $CHF_3$, $C_2F_6$, $C_3F_8$, $C_4F_8$, $CCl_2F_2$, $CCl_4$, $CBrF_3$, $BCl_3$, $PCl_3$, $SF_6$, and $Cl_2$; oxygen-containing gases, such as $O_2$, CO, and $CO_2$; inert gases, such as He, $N_2$, and Ar; and $H_2$ and $NH_3$. A mixed gas of these gases may be used.

In the above-described process including the steps of (1) to (6), the cured product pattern 110 having a desired relief pattern (derived from the relief pattern in the mold 104) in a desired position is formed, and, thus, an article having the cured product pattern is completed. If the substrate 102 is processed using the cured product pattern 110, a processing step (Step of (7)) is performed on the substrate as described below.

Alternatively, the resulting cured product pattern 110 may be used as an optical member, such as a diffraction grating or a polarizer, or a part of such an optical member, for an optical component. In this instance, the optical component includes at least the substrate 102 and the cured product pattern 110 on the substrate 102.

Substrate processing step (7)

The cured product pattern 110 having a relief pattern formed by the method of the present embodiment may be used as an interlayer insulating film of electronic components, such as semiconductor devices, or a resist film used in a semiconductor device manufacturing process. Examples of such a semiconductor device include LSI, system LSI, DRAM, SDRAM, RDRAM, and D-RDRAM.

If the cured product pattern 110 is used as a mask (resist film), portions (regions denoted by 111 in FIG. 1F) of the substrate that have been exposed by step (6), or the etching step, are subjected to etching or ion implantation. In this instance, the cured product pattern 110 functions as an etching mask. In addition, the substrate 102 may be provided with electronic components. Thus, a circuit structure 112 (FIG. 1G) is formed on the substrate 102 according to the shape of the cured product pattern 110. Thus, a circuit board used for a semiconductor device or the like is produced. The resulting circuit board may be connected to a control mechanism for the circuit board for producing an electronic component of a display, a camera, a medical apparatus, or any other apparatus.

Similarly, the cured product pattern 110 may be used as a mask (resist film) for etching or ion implantation in a process for manufacturing an optical component.

Alternatively, the cured product pattern 110 may be used for producing an imprinting mold by etching a quartz substrate that is the substrate 102. In this instance, the quartz substrate may be directly etched using the cured product pattern 110 as a mask. Alternatively, a hard mask material layer may be etched using the cured product pattern 110 as a mask, and the quartz substrate is etched using the thus transferred pattern of the hard mask material as a mask. A second cured product of a second curable material may be formed in the recesses of the cured product pattern 110, and the second cured product may be used as a mask for etching the quartz substrate.

For etching the exposed substrate in part using the cured product pattern 110 as a mask, dry etching can be applied. For the dry etching, a known dry etching apparatus can be used. The source gas used for the dry etching is appropriately selected according to the elemental composition of the cured film to be etched, and examples thereof include halogen-containing gases, such as $CF_4$, $CHF_3$, $C_2F_6$, $C_3F_8$, $C_4F_8$, $CCl_2F_2$, $CCl_4$, $CBrF_3$, $BCl_3$, $PCl_3$, $SF_6$, and $Cl_2$;

oxygen-containing gases, such as $O_2$, CO, and $CO_2$; inert gases, such as He, $N_2$, and Ar, and $H_2$ and $NH_3$. Fluorine-containing gases are suitable, such as $CF_4$, $CHF_3$, $C_2F_6$, $C_3F_8$, $C_4F_8$, $CCl_2F_2$, $CBrF_3$, and $SF_6$. The photocurable composition of an embodiment of the present invention is highly resistant to dry etching using those fluorine-containing gases. A mixed gas of these gases may be used.

In a process for manufacturing a circuit board or the like, the cured product pattern 110 may finally be removed from the processed substrate, or may be left as a member of a device.

EXAMPLES

The present invention will be further described in detail with reference to the following Examples. However, the invention is not limited to the following Examples.

Comparative Example 1

(1) Preparation of Photocurable Composition (b-1)

The following Component (A) and Component (E) (Component (B)) were mixed, and the mixture was filtered through a 0.2 μm ultrahigh molecular weight polyethylene filter to yield photocurable composition (b-1) of Comparative Example 1.

(1-1) Component (A): 94 Parts by Weight in Total

<A-1> Isobornyl acrylate IB-XA (product name, produced by Kyoeisha Chemical): 9.0 parts by weight <A-2> Benzyl acrylate V #160 (product name, produced by Osaka Organic Chemical Industry): 38 parts by weight <A-3> Neopentyl glycol diacrylate NP-A (product name, produced by Kyoeisha Chemical): 47 parts by weight (1-2) Component (B): 3 Parts by Weight in Total <B-1> Lucirin TPO (produced by BASF): 3 parts by weight In photocurable composition (b-1). Component (A) had an Ohnishi parameter $O_A$ of 3.53, and Component (E) had an Ohnishi parameter $O_E$ of 2.30. In photocurable composition (b-1), the content of Component (E) was 3.1% by weight relative to the total weight of Components (A) and (E).

(2) Measurement of Viscosity of Photocurable Composition (b-1)

The viscosity of photocurable composition (b-1) was measured at 25° C. with a cone-plate rotational viscometer RE-85L (manufactured by Toki Sangyo), and the results was 3.80 mPa·s.

(3) Formation of Cured Film of Photocurable Composition (b-1)

Onto a silicon wafer provided with a 60 nm thick adhesion accelerating layer as an adhesion layer, 2 μL of photocurable composition (b-1) was dropped. Then, the dropped photocurable composition (b-1) was covered with a 1 mm thick quartz glass so as to fill a region of a square of 25 mm on a side.

Subsequently, the coating film was irradiated for 200 s through the quartz glass with light that was emitted from a UV light source with an ultrahigh-pressure mercury-vapor lamp and passed through an interference filter. The interference filter was VPF-25C-10-15-31300 (manufactured by Sigmakoki), and the ultraviolet light for irradiation had a single wavelength of 313±5 nm and an illuminance of 1 mW/cm².

After the irradiation, the quartz glass was removed from the coating film. Thus a cured film of photocurable composition (b-1) having an average thickness of 3.2 μm was formed on the silicon wafer.

(4) Measurement of Dry Etching Rate of Photocurable Composition (b-1) Cured Film The resulting cured film of photocurable composition (b-1) was subjected to dry etching for 500 seconds with a ULVAC high-density plasma etching apparatus NE-550, using etching gases $CF_4$ and $CHF_3$ at flow rates of 50 sccm and 50 sccm, respectively. The dry etching rate (nm/s) was calculated from the thickness reduced by the dry etching. The lower the dry etching rate, the higher the dry etching resistance. The results are shown in Table 2.

Comparative Example 2

(1) Preparation of Photocurable Composition (b-2)

The following Component (A) and Component (E) (Component (B)) were mixed, and the mixture was filtered through a 0.2 μm ultrahigh molecular weight polyethylene filter to yield photocurable composition (b-2) of Comparative Example 2.

(1-1) Component (A): 100 Parts by Weight in Total

<A-2> Benzyl acrylate V #160 (product name, produced by Osaka Organic Chemical Industry): 50 parts by weight <A-4> Dimethyloltricyclodecane diacrylate DCP-A (product name, produced by Kyoeisha Chemical): 50 parts by weight (1-2) Component (B): 3 Parts by Weight in Total <B-1> Lucirin TPO (produced by BASF): 3 parts by weight In photocurable composition (b-2), Component (A) had an Ohnishi parameter $O_A$ of 2.94, and Component (E) had an Ohnishi parameter $O_E$ value of 2.30. In photocurable composition (b-2), the content of Component (E) was 2.9% by weight relative to the total weight of Components (A) and (E).

(2) Measurement of Viscosity of Photocurable Composition (b-2)

The viscosity of photocurable composition (b-2) was measured at 25° C. in the same manner as in Comparative Example 1, and the result was 9.3 mPa·s.

(3) Formation of Cured Film of Photocurable Composition (b-2)

A cured film of photocurable composition (b-2) having an average thickness of 3.2 μm was formed on the silicon wafer in the same manner as in Comparative Example 1.

(4) Measurement of Dry Etching Rate of Photocurable Composition (b-2) Cured Film The resulting cured film of photocurable composition (b-2) was subjected to dry etching for 500 seconds in the same manner as in Comparative Example 1, and the dry etching rate was calculated as a relative value to the dry etching rate (=100) of the cured film of photocurable composition (b-1). The results are shown in Table 2.

Comparative Example 3

(1) Preparation of Photocurable Composition (b-3)

The following Component (A) and Component (E) (Component (B)) were mixed, and the mixture was filtered through a 0.2 μm ultrahigh molecular weight polyethylene filter to yield photocurable composition (b-3) of Comparative Example 3.

(1-1) Component (A): 94 Parts by Weight in Total

<A-1> Isobornyl acrylate IB-XA (product name, produced by Kyoeisha Chemical): 9.0 parts by weight <A-2> Benzyl acrylate V #160 (product name, produced by Osaka Organic Chemical Industry): 38 parts by weight <A-3> Neopentyl glycol diacrylate NP-A (product name, produced by Kyoeisha Chemical): 47 parts by weight (1-2) Component (B): 20 Parts by Weight in Total
<B-1> Irgacure 651 (produced by BASF): 20 parts by weight In photocurable composition (b-3), Component (A) had an Ohnishi parameter $O_A$ of 3.53, and Component (E) had an Ohnishi parameter $O_E$ value of 2.69. In photocurable composition (b-3), the content of Component (E) was 17.5% by weight relative to the total weight of Components (A) and (E).

(2) Measurement of Viscosity of Photocurable Composition (b-3)

The viscosity of photocurable composition (b-3) was measured at 25° C. in the same manner as in Comparative Example 1, and the result was 5.3 mPa·s.

(3) Formation of Cured Film of Photocurable Composition (b-3)

A cured film of photocurable composition (b-3) having an average thickness of 3.2 μm was formed on the silicon wafer in the same manner as in Comparative Example 1.

(4) Measurement of Dry Etching Rate of Photocurable Composition (b-3) Cured Film The resulting cured film of photocurable composition (b-3) was subjected to dry etching for 500 seconds in the same manner as in Comparative Example 1, and the dry etching rate was calculated as a relative value to the dry etching rate (=100) of the cured film of photocurable composition (b-1). The results are shown in Table 2.

Comparative Example 4

(1) Preparation of Photocurable Composition (b-4)

The following Component (A) and Component (E) (Component (B)) were mixed, and the mixture was filtered through a 0.2 μm ultrahigh molecular weight polyethylene filter to yield photocurable composition (b-4) of Comparative Example 4.

(1-1) Component (A): 94 Parts by Weight in Total
<A-1> Isobornyl acrylate IB-XA (product name, produced by Kyoeisha Chemical): 9.0 parts by weight
<A-2> Benzyl acrylate V #160 (product name, produced by Osaka Organic Chemical Industry): 38 parts by weight
<A-3> Neopentyl glycol diacrylate NP-A (product name, produced by Kyoeisha Chemical): 47 parts by weight (1-2) Component (B): 20 Parts by Weight in Total
<B-1> Lucirin TPO (produced by BASF): 20 parts by weight In photocurable composition (b-4), Component (A) had an Ohnishi parameter $O_A$ of 3.53, and Component (E) had an Ohnishi parameter $O_E$ of 2.3. In photocurable composition (b-4), the content of Component (E) was 17.5% by weight relative to the total weight of Components (A) and (E).

(2) Measurement of Viscosity of Photocurable Composition (b-4)

The viscosity of photocurable composition (b-4) was measured at 25° C. in the same manner as in Comparative Example 1, and the result was 6.3 mPa·s.

(3) Formation of Cured Film of Photocurable Composition (b-4)

A cured film of photocurable composition (b-4) having an average thickness of 3.2 μm was formed on the silicon wafer in the same manner as in Comparative Example 1.

(4) Measurement of Dry Etching Rate of Photocurable Composition (b-4) Cured Film The resulting cured film of photocurable composition (b-4) was subjected to dry etching for 500 seconds in the same manner as in Comparative Example 1, and the dry etching rate was calculated as a relative value to the dry etching rate (=100) of the cured film of photocurable composition (b-1). The results are shown in Table 2.

Comparative Example 5

(1) Preparation of Photocurable Composition (b-5)

The following Component (A) and Component (E) (Component (B)) were mixed, and the mixture was filtered through a 0.2 m ultrahigh molecular weight polyethylene filter to yield photocurable composition (b-5) of Comparative Example 5.

(1-1) Component (A): 94 Parts by Weight in Total
<A-1> Isobornyl acrylate IB-XA (product name, produced by Kyoeisha Chemical): 9.0 parts by weight
<A-2> Benzyl acrylate V #160 (product name, produced by Osaka Organic Chemical Industry): 38 parts by weight
<A-3> Neopentyl glycol diacrylate NP-A (product name, produced by Kyoeisha Chemical): 47 parts by weight (1-2) Component (B): 8 Parts by Weight in Total
<B-1> Lucirin TPO (produced by BASF): 3 parts by weight
<B-2> Benzophenone (produced by Tokyo Chemical Industry): 5 parts by weight In photocurable composition (b-5), Component (A) had an Ohnishi parameter $O_A$ of 3.53, and Component (E) had an Ohnishi parameter $O_E$ of 2.07. In photocurable composition (b-5), the content of Component (E) was 7.8% by weight relative to the total weight of Components (A) and (E).

(2) Measurement of Viscosity of Photocurable Composition (b-5)

The viscosity of photocurable composition (b-5) was measured at 25° C. in the same manner as in Comparative Example 1, and the result was 4.1 mPa·s.

(3) Formation of Cured Film of Photocurable Composition (b-5)

A cured film of photocurable composition (b-5) having an average thickness of 3.2 μm was formed on the silicon wafer in the same manner as in Comparative Example 1.

(4) Measurement of Dry Etching Rate of Photocurable Composition (b-5) Cured Film The resulting cured film of photocurable composition (b-5) was subjected to dry etching for 500 seconds in the same manner as in Comparative Example 1, and the dry etching rate was calculated as a relative value to the dry etching rate (=100) of the cured film of photocurable composition (b-1). The results are shown in Table 2.

Example 1

(1) Preparation of Photocurable Composition (a-1)

The following Component (A) and Component (E) (Component (B)) were mixed, and the mixture was filtered through a 0.2 μm ultrahigh molecular weight polyethylene filter to yield photocurable composition (a-1) of Example 1.

(1-1) Component (A): 94 Parts by Weight in Total
<A-1> Isobornyl acrylate IB-XA (product name, produced by Kyoeisha Chemical): 9.0 parts by weight
<A-2> Benzyl acrylate V #160 (product name, produced by Osaka Organic Chemical Industry): 38 parts by weight
<A-3> Neopentyl glycol diacrylate NP-A (product name, produced by Kyoeisha Chemical): 47 parts by weight (1-2) Component (B): 13 Parts by Weight in Total
<B-1> Lucirin TPO (produced by BASF): 3 parts by weight <B-2> Benzophenone (produced by Tokyo Chemical Industry): 10 parts by weight In photocurable composition (a-1), Component (A) had an Ohnishi parameter $O_A$ of 3.53, and Component (E) had an Ohnishi parameter $O_E$ of 2.04. In photocurable composition (a-1), the content of Component (E) was 12.1% by weight relative to the total weight of Components (A) and (E).

(2) Measurement of Viscosity of Photocurable Composition (a-1)

The viscosity of photocurable composition (a-1) was measured at 25° C. in the same manner as in Comparative Example 1, and the result was 4.3 mPa·s.

(3) Formation of Cured Film of Photocurable Composition (a-1)

A cured film of photocurable composition (a-1) having an average thickness of 3.2 μm was formed on the silicon wafer in the same manner as in Comparative Example 1.

(4) Measurement of Dry Etching Rate of Photocurable Composition (a-1) Cured Film The resulting cured film of photocurable composition (a-1) was subjected to dry etching for 500 seconds in the same manner as in Comparative Example 1, and the dry etching rate was calculated as a relative value to the dry etching rate (=100) of the cured film of photocurable composition (b-1). The results are shown in Table 2.

Example 2

(1) Preparation of Photocurable Composition (a-2)

The following Component (A) and Component (E) (or (B)) were mixed, and the mixture was filtered through a 0.2 μm ultrahigh molecular weight polyethylene filter to yield photocurable composition (a-2) of Example 2.

(1-1) Component (A): 94 Parts by Weight in Total
<A-1> Isobornyl acrylate IB-XA (product name, produced by Kyoeisha Chemical): 9.0 parts by weight
<A-2> Benzyl acrylate V #160 (product name, produced by Osaka Organic Chemical Industry): 38 parts by weight
<A-3> Neopentyl glycol diacrylate NP-A (product name, produced by Kyoeisha Chemical): 47 parts by weight
(1-2) Component (B): 18 Parts by Weight in Total
<B-1> Lucirin TPO (produced by BASF): 3 parts by weight
<B-2> Benzophenone (produced by Tokyo Chemical Industry): 15 parts by weight Photocurable composition (a-2) had an $O_A$ value of 3.53 and an $O_E$ value of 2.03. In photocurable composition (a-2), the content of Component (E) or (B) was 16.1% by weight relative to the total weight of Components (A) and (E).

(2) Measurement of Viscosity of Photocurable Composition (a-2)

The viscosity of photocurable composition (a-2) was measured at 25° C. in the same manner as in Comparative Example 1, and the result was 4.4 mPa·s.

(3) Formation of Cured Film of Photocurable Composition (a-2)

A cured film of photocurable composition (a-2) having an average thickness of 3.2 μm was formed on the silicon wafer in the same manner as in Comparative Example 1.

(4) Measurement of Dry Etching Rate of Photocurable Composition (a-2) Cured Film The resulting cured film of photocurable composition (a-2) was subjected to dry etching for 500 seconds in the same manner as in Comparative Example 1, and the dry etching rate was calculated as a relative value to the dry etching rate (=100) of the cured film of photocurable composition (b-1). The results are shown in Table 2.

Example 3

(1) Preparation of Photocurable Composition (a-3)

The following Component (A) and Component (E) (Component (B)) were mixed, and the mixture was filtered through a 0.2 μm ultrahigh molecular weight polyethylene filter to yield photocurable composition (a-3) of Example 3.

(1-1) Component (A): 94 Parts by Weight in Total
<A-1> Isobornyl acrylate IB-XA (product name, produced by Kyoeisha Chemical): 9.0 parts by weight
<A-2> Benzyl acrylate V #160 (product name, produced by Osaka Organic Chemical Industry): 38 parts by weight
<A-3> Neopentyl glycol diacrylate NP-A (product name, produced by Kyoeisha Chemical): 47 parts by weight
(1-2) Component (B): 23 Parts by Weight in Total
<B-1> Lucirin TPO (produced by BASF): 3 parts by weight
<B-2> Benzophenone (produced by Tokyo Chemical Industry): 20 parts by weight In photocurable composition (a-3), Component (A) had an Ohnishi parameter $O_A$ of 3.53, and Component (E) had an Ohnishi parameter $O_E$ of 2.02. In photocurable composition (a-3), the content of Component (E) was 19.7% by weight relative to the total weight of Components (A) and (E).

(2) Measurement of Viscosity of Photocurable Composition (a-3)

The viscosity of photocurable composition (a-3) was measured at 25° C. in the same manner as in Comparative Example 1, and the result was 4.6 mPa·s.

(3) Formation of Cured Film of Photocurable Composition (a-3)

A cured film of photocurable composition (a-1) having an average thickness of 3.2 μm was formed on the silicon wafer in the same manner as in Comparative Example 1.

(4) Measurement of Dry Etching Rate of Photocurable Composition (a-3) Cured Film The resulting cured film of photocurable composition (a-3) was subjected to dry etching for 500 seconds in the same manner as in Comparative Example 1, and the dry etching rate was calculated as a relative value to the dry etching rate (=100) of the cured film of photocurable composition (b-1). The results are shown in Table 2.

Conclusion of Comparative Examples and Examples

The results of Comparative Examples 1 to 5 and Examples 1 to 3 are shown in Table 2 together.

TABLE 2

| | Photocurable composition | Proportion (wt %) of Component (E) | Weight average molecular weight of Component (E) | $O_A$-$O_E$ | $O_{AE}$ | Viscosity (mPa·s) | Dry etching rate* |
|---|---|---|---|---|---|---|---|
| Comparative Example 1 | b-1 | 3.1 | 348.4 | 1.23 | 3.51 | 3.8 | 100 |
| Comparative Example 2 | b-2 | 2.9 | 348.4 | 0.64 | 2.92 | 93 | 80 |

TABLE 2-continued

| | Photocurable composition | Proportion (wt %) of Component (E) | Weight average molecular weight of Component (E) | $O_A$-$O_E$ | $O_{AE}$ | Viscosity (mPa·s) | Dry etching rate* |
|---|---|---|---|---|---|---|---|
| Comparative Example 3 | b-3 | 17.5 | 256.3 | 0.84 | 3.42 | 5.3 | 97 |
| Comparative Example 4 | b-4 | 17.5 | 348.4 | 1.23 | 3.40 | 6.3 | 92 |
| Comparative Example 5 | b-5 | 7.8 | 244.5 | 1.46 | 3.43 | 4.1 | 95 |
| Example 1 | a-1 | 12.1 | 220.6 | 1.49 | 3.36 | 4.3 | 90 |
| Example 2 | a-2 | 16.1 | 209.9 | 1.50 | 3.30 | 4.4 | 87 |
| Example 3 | a-3 | 19.7 | 203.9 | 1.51 | 3.24 | 4.6 | 82 |

*relative to the dry etching rate of Composition (b-1)

Photocurable composition (b-1) of Comparative Example 1 had a low viscosity, but the dry etching resistance thereof was low. Photocurable composition (b-2) of Comparative Example 2, in which Component (A) had a different composition from that in (b-1), exhibited higher dry etching resistance than composition (b-1) of Comparative Example 1, while the viscosity was considerably increased.

For photocurable composition (b-3) of Comparative Example 3, which had an $O_A$-$O_E$ value of lower than 1.00, the dry etching resistance was not increased much even though the proportion of Component (E) was increased. For photocurable composition (b-4) of Comparative Example 4, the dry etching resistance was increased due to the $O_A$-$O_E$ value as high as more than 1.00, while the viscosity was increased due to the weight average molecular weight higher than 250 of Component (E).

For photocurable composition (b-5) of Comparative Example 5, which had an $O_A$-$O_E$ value as high as more than 1.00 and in which Component (E) had a weight average molecular weight of less than 250, the dry etching resistance was slightly increased without increasing the viscosity. The dry etching resistance was however insufficient due to the proportion of Component (E) as low as less than 10% by weight.

On the other hand, photocurable compositions (a-1), (a-2) and (a-3) of Examples 1 to 3 exhibited satisfactory viscosities and high dry etching resistances in a good balance. Hence, the photocurable compositions of Examples 1 to 3 are expected to enable photo-nanoimprinting with high productivity and high yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photocurable composition comprising:
a polymerizable compound (A) having a parameter $O_A=N_A/(N_{C,A}-N_{O,A})$, where $O_A$ represents the Ohnishi parameter $O_A$ of the polymerizable compound (A), $N_A$ represents the total number of atoms in the molecule of the polymerizable compound (A), $N_{C,A}$ represents the number of carbon atoms in the molecule of the polymerizable compound (A), and $N_{O,A}$ represents the number of oxygen atoms in the molecule of the polymerizable compound (A); and a non-polymerizable component (E) in a proportion in the range of more than 10% to 50% by weight relative to the total weight of the polymerizable compound (A) and the non-polymerizable component (E), wherein the non-polymerizable component (E) has a weight average molecular weight of 250 or less, the non-polymerizable component (E) contains at least one non-polymerizable compound (X) including a photopolymerization initiator (B), and the at least one non-polymerizable compound (X) has a parameter $O_X=N_X/(N_{C,X}-N_{O,X})$, where $O_X$ represents the Ohnishi parameters $O_X$ of compounds (X) contained in the non-polymerizable component (E), $N_X$ represents the total number of atoms in the molecule of the corresponding compound (X), $N_{C,X}$ represents the number of carbon atoms in the molecule of the corresponding compound (X), and $N_{O,X}$ represents the number of oxygen atoms in the molecule of the corresponding compound (X), wherein the photocurable composition satisfies the following relational expressions (1) and (2):

$$O_A-O_E>1.00 \qquad (1), \text{ and}$$

$$O_{AE}<3.40 \qquad (2),$$

wherein $O_E$ represents the molar fraction weighted average of the parameters $O_X$ of the at least one non-polymerizable compound (X), and $O_{AE}$ represents the molar fraction weighted average of the parameters $O_A$ and $O_E$, and the non-polymerizable component (E) is nonvolatile organic compound.

2. The photocurable composition according to claim 1, wherein the photocurable composition has a viscosity in the range of 1 mPa·s to 6 mPa·s.

3. The photocurable composition according to claim 1, wherein $O_E$ is less than 2.20.

4. The photocurable composition according to claim 1, wherein the proportion of the non-polymerizable component (E) is in the range of 15% to 50% by weight relative to the total weight of the polymerizable compound (A) and the non-polymerizable component (E).

5. The photocurable composition according to claim 1, wherein the photocurable composition contains substantially no volatile solvent.

6. The photocurable composition according to claim 1, wherein the non-polymerizable component (E) contains at least one compound selected from the group consisting of benzophenone, biphenyl, and p-terphenyl.

7. The photocurable composition according to claim 1, wherein the photocurable composition is used for photo-nanoimprinting.

8. The photocurable composition according to claim 1, wherein the non-polymerizable component (E) is an internal releasing agent composed of a surfactant.

9. The photocurable composition according to claim 8, wherein the surfactant is at least one of the following: a silicone surfactant, a fluorosurfactant, or a hydrocarbon surfactant.

10. The photocurable composition according to claim 1, wherein the non-polymerizable component (E) is in a proportion in the range of 12.1% to 50% by weight relative to the total weight of the polymerizable compound (A) and the non-polymerizable component (E).

11. The photocurable composition according to claim 1, wherein the non-polymerizable component (E) is in a proportion in the range of 16.1% to 20% by weight relative to the total weight of the polymerizable compound (A) and the non-polymerizable component (E).

12. The photocurable composition according to claim 1, wherein the photocurable composition has a viscosity less than 100 mPa·s.

13. A cured product including a photocurable composition cured on a substrate by irradiating the photocurable composition with light while the photocurable composition is in contact with a mold to receive a pattern from the mold, wherein the photocurable composition is prepared by a process comprising:

presenting a photocurable composition having:
a polymerizable compound (A) having a parameter $O_A=N_A/(N_{C,A}-N_{O,A})$, where $O_A$ represents the Ohnishi parameter $O_A$ of the polymerizable compound (A), $N_A$ represents the total number of atoms in the molecule of the polymerizable compound (A), $N_{C,A}$ represents the number of carbon atoms in the molecule of the polymerizable compound (A), and $N_{O,A}$ represents the number of oxygen atoms in the molecule of the polymerizable compound (A), and a non-polymerizable component (E) containing at least one non-polymerizable compound (X) including a photopolymerization initiator (B), in a proportion in the range of more than 10% to 50% by weight relative to the total weight of the polymerizable compound (A) and the non-polymerizable component (E), wherein the non-polymerizable component (E) has a weight average molecular weight of 250 or less, and the at least one non-polymerizable compound (X) has a parameter $O_X=N_X/(N_{C,X}-N_{O,X})$, where $O_X$ represents the Ohnishi parameters $O_X$ of compounds (X) contained in the non-polymerizable component (E), $N_X$ represents the total number of atoms in the molecule of the corresponding compound (X), $N_{C,X}$ represents the number of carbon atoms in the molecule of the corresponding compound (X), and $N_{O,X}$ represents the number of oxygen atoms in the molecule of the corresponding compound (X), wherein the photocurable composition satisfies the following relational expressions (1) and (2):

$$O_A-O_E>1.00 \qquad (1), \text{ and}$$

$$O_{AE}<3.40 \qquad (2),$$

wherein $O_E$ represents the molar fraction weighted average of the parameters $O_X$ of the at least one non-polymerizable compound (X), and $O_{AE}$ represents the molar fraction weighted average of the parameters $O_A$ and $O_E$.

14. The method according to claim 13, wherein a sequence from the first step to the fourth step is performed a plurality of times on different regions of the substrate.

15. The method according to claim 13, wherein the mold has a pattern in the surface thereof, and the third step is performed by irradiating the photocurable composition with light through the mold.

16. The method according to claim 13, wherein the second step is performed in an atmosphere containing a condensable gas.

17. The method according to claim 16, wherein the condensable gas is 1,1,1,3,3-pentafluoropropane.

18. A method for manufacturing an imprinting mold, comprising:

forming a cured product pattern by the method as set forth in claim 13; and etching the substrate using the cured product pattern.

19. An optical component including a photocurable composition cured on a substrate by irradiating the photocurable composition with light while the photocurable composition is in contact with a mold to receive a pattern from the mold, wherein the photocurable composition is prepared by a process comprising:

presenting a photocurable composition having:
a polymerizable compound (A) having a parameter $O_A=N_A/(N_{C,A}-N_{O,A})$, where $O_A$ represents the Ohnishi parameter $O_A$ of the polymerizable compound (A), $N_A$ represents the total number of atoms in the molecule of the polymerizable compound (A), $N_{C,A}$ represents the number of carbon atoms in the molecule of the polymerizable compound (A), and $N_{O,A}$ represents the number of oxygen atoms in the molecule of the polymerizable compound (A), and a non-polymerizable component (E) containing at least one non-polymerizable compound (X) including a photopolymerization initiator (B), in a proportion in the range of more than 10% to 50% by weight relative to the total weight of the polymerizable compound (A) and the non-polymerizable component (E), wherein the non-polymerizable component (E) has a weight average molecular weight of 250 or less, and the at least one non-polymerizable compound (X) has a parameter $O_X=N_X/(N_{C,X}-N_{O,X})$, where $O_X$ represents the Ohnishi parameters $O_X$ of compounds (X) contained in the non-polymerizable component (E), $N_X$ represents the total number of atoms in the molecule of the corresponding compound (X), $N_{C,X}$ represents the number of carbon atoms in the molecule of the corresponding compound (X), and $N_{O,X}$ represents the number of oxygen atoms in the molecule of the corresponding compound (X), wherein the photocurable composition satisfies the following relational expressions (1) and (2):

$$O_A-O_E>1.00 \qquad (1), \text{ and}$$

$$O_{AE}<3.40 \qquad (2),$$

wherein $O_E$ represents the molar fraction weighted average of the parameters $O_X$ of the at least one non-polymerizable compound (X), and $O_{AE}$ represents the molar fraction weighted average of the parameters $O_A$ and $O_E$.

20. A circuit board having a substrate etched or ion implantated using, as a mask, a photocurable composition cured on the substrate by irradiating the photocurable composition with light while the photocurable composition is in contact with a mold to receive a pattern from the mold, wherein the photocurable composition is prepared by a process comprising:

presenting a photocurable composition having:
a polymerizable compound (A) having a parameter $O_A = N_A/(N_{C,A}-N_{O,A})$, where $O_A$ represents the Ohnishi parameter $O_A$ of the polymerizable compound (A), $N_A$ represents the total number of atoms in the molecule of the polymerizable compound (A), $N_{C,A}$ represents the number of carbon atoms in the molecule of the polymerizable compound (A), and $N_{O,A}$ represents the number of oxygen atoms in the molecule of the polymerizable compound (A), and a non-polymerizable component (E) containing at least one non-polymerizable compound (X) including a photopolymerization initiator (B), in a proportion in the range of more than 10% to 50% by weight relative to the total weight of the polymerizable compound (A) and the non-polymerizable component (E), wherein the non-polymerizable component (E) has a weight average molecular weight of 250 or less, and the at least one non-polymerizable compound (X) has a parameter $O_X=N_X/(N_{C,X}-N_{O,X})$, where $O_X$ represents the Ohnishi parameters $O_X$ of compounds (X) contained in the non-polymerizable component (E), $N_X$ represents the total number of atoms in the molecule of the corresponding compound (X), $N_{C,X}$ represents the number of carbon atoms in the molecule of the corresponding compound (X), and $N_{O,X}$ represents the number of oxygen atoms in the molecule of the corresponding compound (X), wherein the photocurable composition satisfies the following relational expressions (1) and (2):

$$O_A - O_E > 1.00 \tag{1}$$

and $$O_{AE} < 3.40 \tag{2},$$

wherein $O_E$ represents the molar fraction weighted average of the parameters $O_X$ of the at least one non-polymerizable compound (X), and $O_{AE}$ represents the molar fraction weighted average of the parameters $O_A$ and $O_E$.

21. The method according to claim 20, wherein the etching is performed using a gas containing at least one selected from the group consisting of $CF_4$, $CHF_3$, $C_2F_6$, $C_3F_8$, $C_4F_8$, $CCl_2F_2$, $CBrF_3$, and $SF_6$.

22. The circuit board according to claim 20, wherein the circuit board is part of a semiconductor device.

* * * * *